(12) United States Patent
Liu et al.

(10) Patent No.: US 6,306,685 B1
(45) Date of Patent: Oct. 23, 2001

(54) METHOD OF MOLDING A BUMP CHIP CARRIER AND STRUCTURE MADE THEREBY

(75) Inventors: P. C. Liu; Shih-Ching Chang, both of Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 09/495,460

(22) Filed: Feb. 1, 2000

(51) Int. Cl.⁷ ................................................ H01L 21/44
(52) U.S. Cl. .......................... 438/121; 438/122; 438/124
(58) Field of Search ................................. 438/121, 122, 438/124

(56) References Cited

U.S. PATENT DOCUMENTS

| | | | |
|---|---|---|---|
| 4,493,143 | * 1/1985 | Maier | 29/590 |
| 4,953,005 | * 8/1990 | Carlson et al. | 357/80 |
| 5,172,213 | * 12/1992 | Zimmerman | 257/796 |
| 5,489,059 | * 2/1996 | Rostoker et al | 228/175 |
| 5,562,971 | * 10/1996 | Tsuru et al. | 428/209 |
| 5,905,299 | * 5/1999 | Lacap | 257/666 |
| 5,994,212 | * 11/1999 | Arakawa et al. | 438/617 |
| 6,087,204 | * 7/2000 | Fogelson | 438/123 |
| 6,091,157 | * 7/2000 | Black et al. | 257/790 |
| 6,093,584 | * 7/2000 | Fjelstad | 438/127 |

FOREIGN PATENT DOCUMENTS

| | | | |
|---|---|---|---|
| 554893-A2 | * 8/1993 | (EP) | H01L/23/31 |
| 361247060-A | * 11/1986 | (JP) | H01L/21/60 |

OTHER PUBLICATIONS

N/A, "Low Profile, Pseudo Wafer, Multi–chip Package." IBM Technical Disclosure Bulletin, vol. 34, issue No. 3, pp. 145–147, Aug. 1, 1991.*

* cited by examiner

Primary Examiner—Matthew Smith
Assistant Examiner—Renzo N. Rocchegiani
(74) Attorney, Agent, or Firm—Abelman, Frayne & Schwab

(57) ABSTRACT

A method of molding a bump chip carrier is disclosed, which includes at least the following sequential steps:
- a step of applying dry films: applying dry films to the top and bottom surface of a copper base plate having a suitable thickness;
- a step of forming a circuit pattern on each one of the dry films: forming a circuit pattern on each one of the dry films by a photo engraving process;
- a step of plating: plating variable metals (arranged in a desired sequence) onto each of the circuit patterns to form connection pads and an exothermic passage;
- a step of removing the dry films;
- a step of mounting and wire-bonding a die: fixedly mounting a die on the copper base plate and bonding the die to the connection pads by wires;
- a step of molding: molding the surfaces of the copper base plate on which the die is mounted to form a molding layer; and
- a step of removing parts of the copper base plate: etching out of the exposed parts of copper base plate situated on the bottom of the molding layer.

Also disclosed is a structure of bump chip carrier made by the foregoing method.

6 Claims, 6 Drawing Sheets

METHOD OF MOLDING A BUMP CHIP CARRIER AND STRUCTURE MADE THEREBY

BACKGROUND OF THE INVENTION

1. Field of the Invention

The present invention relates to a method of molding a bump chip carrier, more particularly, to a method of molding a bump chip carrier, which reduces the manufacturing steps and the manufacturing time and allows a relatively thin and lighter chip having better exothermic characteristics to

2. Description of Related Art

A conventional bump chip carrier molding method shown in FIG. 5 comprises the steps listed below.

First as shown in A of FIG. 5, provide a copper base plate (80) having a thickness suitable for carrying a die, preferably a thickness of at least 10 mil.

As shown in B of FIG. 5, half-etch the copper base plate (80) to prepare connection cavities (81). The term "half-etching" refers to etching the copper base plate to a depth of half the thickness of the etched copper base plate without totally penetrating the copper base plate.

Then, as shown in C of FIG. 5, multiple plate (in the sequence of) Gd, Pd, Ni, and Pd into each connection cavity (81) (see FIG. 6) to form a metallized connection point (83) used for connecting a die to components located outside.

As shown in D of FIG. 6, then fixedly mount a die (82) on the central part of the copper base plate (80) and connect the die (82) to each metallized connection point (83) with bonding wires.

As shown in E of FIG. 5, apply a molding layer (84) to the top surface of the copper base plate (80).

As shown in F of FIG. 5, etch out the excessive parts of the copper base plate (80) completely so that the bottom of the die (82) and the metallized connection points (83) are exposed from the bottom surface of the molding layer (84).

As shown in G of FIG. 5, plate an exothermal metal passage (85) to the bottom surface of the die (82).

Though this conventional method solves many problems involved in the molding of the bump chip carrier, some difficulties are still found in it:

1. It is not easy to precisely control the half-etching process, since the requirements for the half-etching process in terms of precision are very critical. The conventional method employs the half-etching process to form the connection cavities used for forming metallized connection points. However, it is not easy to control the etching depth in such a process. Therefore, if the half-etching process is not controlled well enough, either insufficient or excessive etching will occur and adversely affect the quality of molding thereby increasing the manufacturing cost.

3. The manufacturing cost is too high. Since the half-etching step is employed, the thickness of the copper base plate (80) for carrying the die (82) should be limited to a certain range. In practice, this thickness of the copper base plate (80) is over 10 mil. In addition, the copper base plate (80) must be totally etched out. Therefore, the cost for the copper base plate used will be very high due to the large thickness requirements of the copper base plate (80), and an unnecessary waste of copper material will occur due to totally etching out the copper base plate (80).

4. The manufacturing steps are excessive. To form the metallized connection points in accordance with the conventional method involves four plating procedures resulting in both excessive steps and long manufacturing time.

Therefore, there is still a need to resolve the above-mentioned problems and difficulties.

SUMMARY OF THE INVENTION

The objective of the present invention is to provide a method of molding a bump chip carrier, which reduces the manufacturing steps and the manufacturing time and allows a relatively thin and lighter die having better exothermic characteristics to be packaged.

To achieve the objective, the method of molding a bump chip carrier in accordance with the present invention comprises the following steps.

Applying dry films: apply dry films to the top and bottom surfaces of a copper base plate having a suitable thickness.

Forming a circuit pattern on each of the dry films: form a circuit pattern on each of the dry films by using a photo engraving process.

Plating: plate variable metals (arranged in a desired sequence) onto each of the circuit patterns to form a connection pad.

Remove the dry films.

Mounting and wire-bonding a die: fixedly mount a die on the copper base plate and bond the die to the connection pads with wires.

Molding: mold one of the surfaces of the copper base plate to form a molding layer.

Removing excessive parts of the copper base plate: etch out the excessive parts of the copper base plate situated under the bottom face of the molding layer.

The connection pads and the exothermal metal passage can be formed at the same time in the method in accordance with the present invention to effectively reduce the cost and allow a relatively light and thin chip to be made thereby.

In the step of "forming circuit patterns", the circuit pattern of the connection pad for connecting the die can be transferred to the dry film under the bottom surface of the copper base plate, while, most preferably, the circuit pattern of the exothermal metal passage is simultaneously transferred to the bottom of the copper base plate.

In the "Plating step", a gold layer and a nickel layer are sequentially plated onto the circuit pattern of the connection pads.

Optionally, in the "plating step", a nickel layer, a palladium layer and a gold layer are sequentially plated onto the circuit pattern of the connection pads.

Other objectives, advantages, and novel features of the invention will become more apparent from the following detailed description when taken in conjunction with the accompanying drawings.

DETAILED DESCRIPTION OF THE PREFERRED EMBODIMENT

Figure 1:
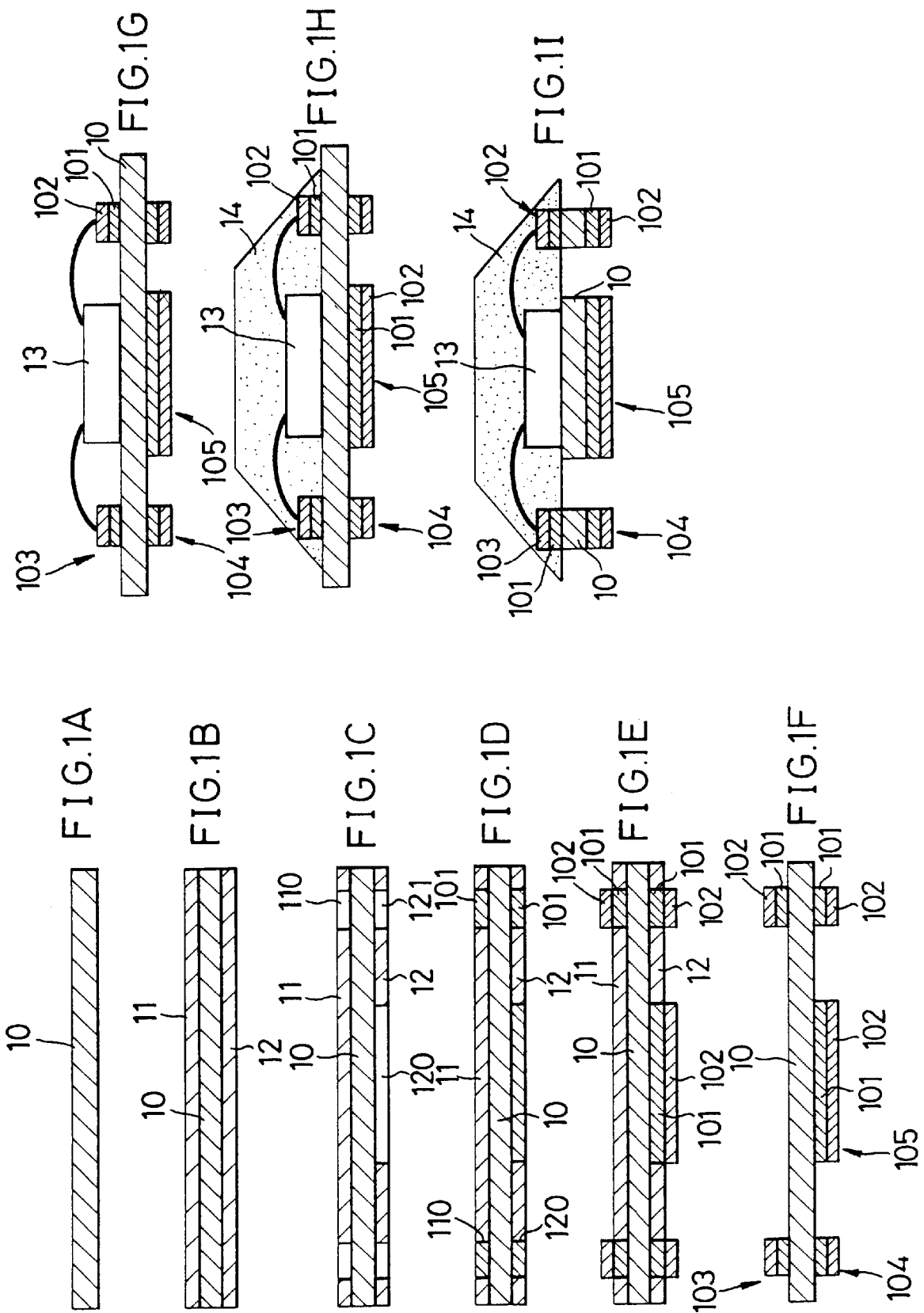
FIGS. 1A–1I are a sequence diagrams of one preferable embodiment of the method of molding a bump chip carrier and the structure made thereby in accordance with the present invention.

The first one of the preferable embodiments of the manufacturing steps of the method in accordance with the present invention is shown in FIG. 1. As shown in FIG. 1, a copper base plate (10) with a suitable thickness is chosen to serve as a carrier plate in the present invention. In this embodiment, the thickness of the copper base plate (10) can be as low as 4 mil to 5 mil. After supplying this copper base plate (10), the method of molding a bump chip carrier in accordance with the present invention is carried out in the following sequence of steps.

Applying Dry Films (see B of FIG. 1)

A dry film (11, 12) is applied to the top and bottom surface of the copper base plate (10). The dry films (11, 12) are essentially used for the transfer of the circuit patterns.

Forming Circuit Patterns On Each of the Films (see C of FIG. 1)

Circuit patterns are formed on the dry films (11, 12) by the photo engraving process. Since the photo engraving process is well known to those skilled in the art, it will not be described in detail here. This step is roughly set forth as follows:

Masks each having a certain circuit pattern are put on the surface of the dry films (11, 12). Then, each dry film (11, 12) together with the mask itself is exposed to ultra violet radiation. After being exposed to the ultra violet radiation, the circuit pattern of each of the masks is transferred to the corresponding dry film (11, 12) and the part of each dry film (11, 12) having the circuit pattern formed by means of being exposed to the ultra violet radiation becomes soluble. Afterward, the circuit pattern on each dry film (11, 12) is developed by the etching procedure so as to remove the exposed film and the so patterned parts on each film (11, 12). Then, engraved circuit patterns (110, 120, 121) are respectively formed, such that the parts of the copper base plated (10) corresponding to the engraved circuit patterns (110, 120, 121) are exposed.

In this embodiment, the circuit pattern (110) formed on the dry film (11) on the top surface of the copper base plate (10) is used for bonding wires to die connection pad located beside the die. It is also useful for simultaneously forming a connection pad (or external connection pad) at a location where the carrier pad of the die (die pad) is formed. (The foregoing carrier pad refers to the part of the copper base plate where a die is predetermined to be carried.) The circuit patterns (120, 121) on the dry film (12) on the bottom surface of the copper base plate (10) are used for forming external connection pads and an exothermal metal passage.

Plating (see D and E of FIG. 1)

Variable metals (arranged in a desired sequence) are plated onto the circuit patterns (110, 120, 121) of the exposed copper base plated (10) to form the connection pads and exothermal metal passage.

In this embodiment, nickel layers (101) and gold layers (102) each with a suitable thickness, respectively shown in D and E of FIG. 1, are sequentially plated onto the circuit patterns (110, 120, 121), wherein the nickel layers (101) are in contact with the copper base plate (10) and the gold layers (102) are plated on the nickel layer (101) to be used for wire bonding or connecting a die to components from outside. As stated above, each circuit pattern (110) on the dry film (11) on the top surface of the copper base plate (10) also can be used to form a connection pad at the location where the carrier pad (die pad) is situated. However, in consideration of the inferior connection effect between the gold layers and the die, connection pads are not directly formed between the die and the plated pads in this embodiment while the die is directly, fixedly mounted on the carrier pad.

Removing the Dry Films (see F of FIG. 1)

After the step of plating, the dry films (11, 12) on the top and bottom surface of the copper base plate (10) are removed. After removing the dry films (11, 12), the plated layers including the nickel layers (101) and the gold layers (102) each formed by plating them onto a certain location on the copper base plate (10) will respectively be used as a connection pad (103), external connection pad (104) and exothermal metal passage (105) respectively on the top surface and the bottom surface of the copper base plate (10), wherein the exothermal metal passage (105) is located on the bottom surface of the copper base plate (10) corresponding to the position of the die on the top surface of the copper base plated (10).

Mounting and Wire-bonding the Die (see G of FIG. 1)

The die (13) is fixedly mounted on the copper base plate (10). Then, the die (13) is connected to the die connection pad (103) on the top surface of the copper base plate (10) by means of bonding wire between them.

Molding (see H of FIG. 1)

After the step of "mounting and wire bonding the die", only surface of the copper base plate (10) with the die (13) is molded to form a molding layer (14).

Removing the Plate (see I of FIG. 1)

The excessive parts of the copper base plate (10) which are exposed to the air are removed by an etching process to expose parts of the bottom surface of the molding layer (14). However, the die connection pads (103) which are originally located on the top surface of the copper base plate (10) are still electrically connected to the external connection pads (104) through the non-etched parts of the copper base plate (10). In addition, the exothermal metal passage (105) originally located on the bottom of the copper base plate (10), in conjunction with the non-etched parts of the copper base plate (10), forms a direct exothermal means for the die (13).

The foregoing method is simply one preferred embodiment in accordance with the present invention. The second preferred embodiment in accordance with the present invention to be described in the following section is an extension of the previously described method and comprises similar steps, such as applying dry films, forming a circuit pattern, plating, removing the dry films, mounting and wire-bonding the die, molding and removing the plate. However, the plating step of the second embodiment in accordance with the present invention is somewhat different from that of the first embodiment.

Figure 2:
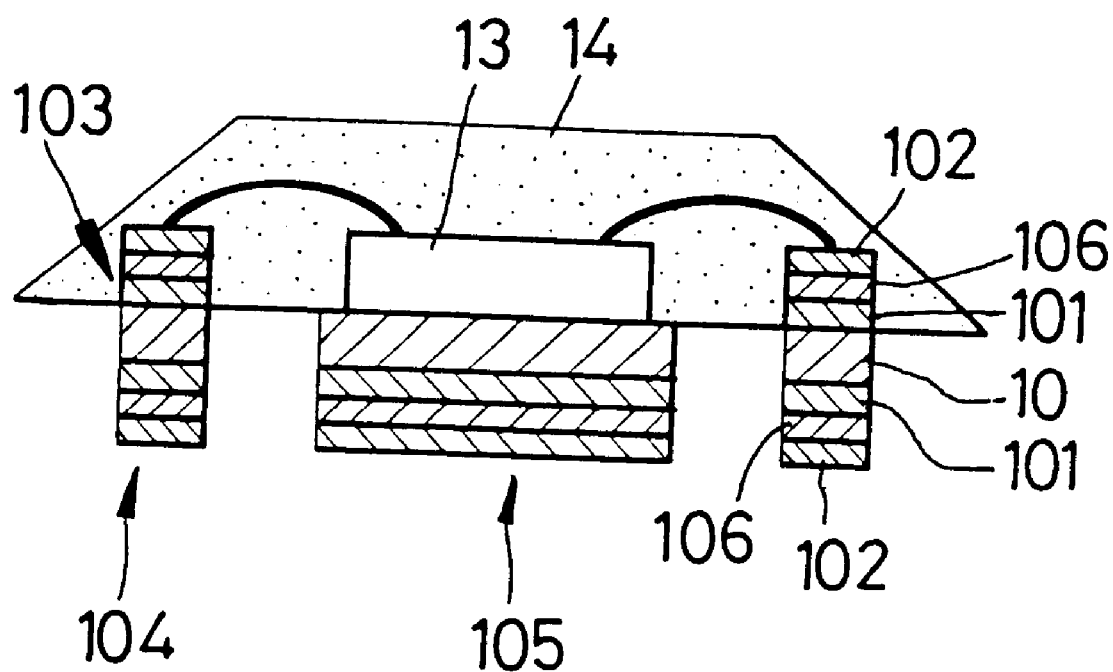
FIG. 2 is a side plan view of another preferred embodiment of the structure of a bump chip carrier in accordance with the present invention.

As can be seen in the first embodiment stated above, a nickel layer (101) and a gold layer (102) are sequentially plated onto the copper base plate (10). In this case, the gold layer (102) is plated on the top layer because the connection ability between the gold layer (102) and the wire material used for wire-bonding is much better. However, gold is a noble metal and very expensive so the thickness of the gold layer (102) must not be excessively thick. Therefore, in order not to penetrate the gold layer (102) during the wire-bonding step, a nickel layer (101), a palladium layer (106) and a gold layer (102), each with a suitable thickness, are sequentially plated onto the top and bottom surface of the copper base plate (10) in the plating step of the second embodiment in accordance with the present invention. The palladium layer (106) located between the gold layer (102) and the nickel layer (101) is used to prevent the gold layer (102) from being penetrated during the wire-bonding step (see FIG. 2).

Figure 3:
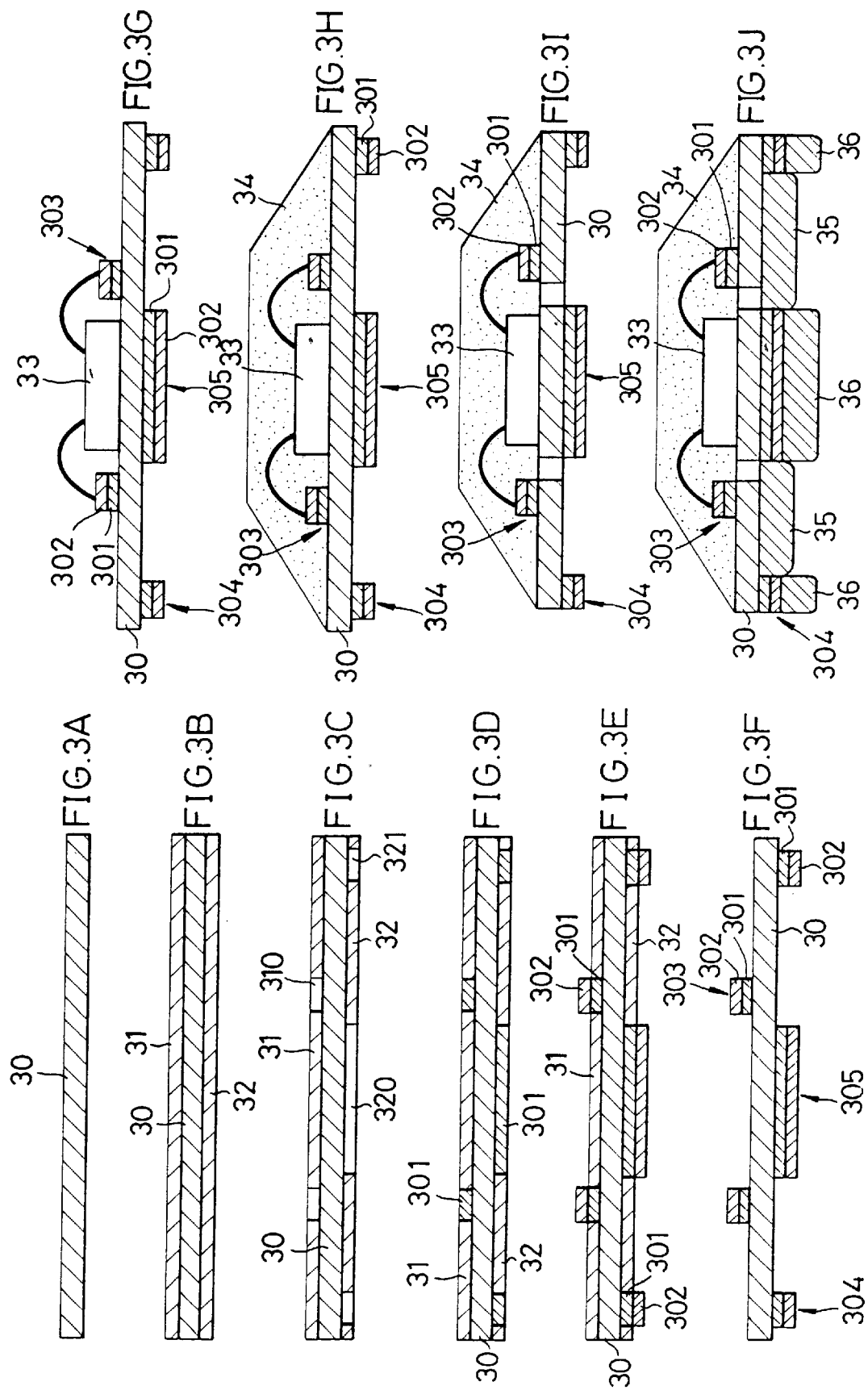
FIGS. 3A–3J are a sequence diagrams of another preferable embodiment of the method of molding a bump chip carrier and the structure made thereby in accordance with the present invention.

The third embodiment in accordance with the present invention, shown in FIG. 3, also begins with the selection of a copper base plate (30) with a suitable thickness to serve as the carrier base plate (as shown in A of FIG. 3). The following steps are performed in sequence to implement the method.

Applying Dry Films (see B of FIG. 3)

Dry films (31, 32) are respectively applied to the top and the bottom surface of the copper base plate (30). The dry films (31, 32) respectively are essentially used for the transfer of an image of a circuit pattern.

Forming a Circuit Pattern on the Films (see C of FIG. 3)

The engraved circuit patterns (310, 320, 321) are respectively formed on the dry films (31, 32) by the photo engraving process. Since the photo engraving process is well known to those skilled in the art and its steps are roughly described in the first embodiment, it will not be described here any more. In this embodiment, the circuit patterns (310) formed on the dry film (31) on the top surface of the copper base plate (30) are used for forming die-connection pads. The circuit patterns (320, 321) under the dry film (32) on the bottom surface of the copper base plate (30) are used for forming external connection pads and an exothermal metal passage, respectively.

Plating (see D and F of FIG. 3)

Variable metals (arranged in a desired sequence) are plated onto the exposed copper base plate (30) in the circuit patterns (310, 320, 321) to form the connection pads and exothermal metal passage.

In this embodiment, nickel layers (301) each with a suitable thickness and gold layers (302) each with a suitable thickness (respectively shown in D and E of FIG. 3) are sequentially plated onto the exposed circuit patterns (310, 320, 321). The nickel layers (301) are in contact with the copper base plate (30) and the gold layers (302) are on the outer surface for wire-bonding or connecting to components from outside. Each plating layer on the top surface of the copper base plate (30) does not correspond to one of the plating layers plated under the bottom of the copper base plate (30). Specifically, the nickel layers (301) and the gold layers (302) plated on the top surface of the copper base plate (30) are located near the position where the die will be mounted. The nickel layers (301) and the gold layers (302) plated on the bottom of the copper base plate (30) are located near the edge of the copper base plate (30). The plating layers on the top and the bottom of the copper base plate (30) are electrically connected by the copper base plate (30). Essentially, such a configuration of plating layers is used for manufacturing a large scale integrated circuits having much more connection leads.

Removing the Dry Films

After the "plating step", the remaining dry films (31, 32) on the top and bottom surface of the copper base plate (30) are removed (see F of FIG. 3). After removing the dry films (31, 32), the plating layers including the nickel layers (301) and the gold layers (302) will respectively be used as die-connection pads (303), external connection pads (304) and an exothermal metal passage (305). The exothermal metal passage (105) is located at a position on the bottom surface of the copper base plate (30) corresponding to the position on the top surface of the copper base plate (30) where the die is pre-determinedly to be carried.

Mounting and Wire-bonding the Die (see G of FIG. 3)

The die (33) is fixedly mounted on the copper base plate (30). Then, the die (33) is connected to the die-connection pads (303) on the top surface of the copper base plate (30) by means of bonding wire between them.

Molding (see H of FIG. 1)

After "mounting and wire-bonding the die", the surface of the copper base plate (30) on which the die (33) is connected is molded to form a molding layer (34).

Removing Plate (see I of FIG. 3)

The parts of the copper base plate (30) among the circuit patterns are removed by an etching process to form an opening condition among the predetermined circuit patterns.

Coating Solder Mask (see I of FIG. 3)

Solder masks (35) are coated on the bottom surfaces of two copper circuits that are part of the copper base plate (30) useful for connecting the die-connection pads (303) to the external connection pads (304) to protect the copper circuits from being exposed and oxidized.

Coating Solder Paste (see I of FIG. 3)

Solder paste (36) is coated on the surface of each of the external connection pads (304) and the exothermal metal passage (305), such that the bump chip carrier made thereby can be connected to a circuit board by a SMT procedure.

The die-connection pads (303) are respectively, electrically connected to one of the external connection pads (304) by the non-etched part of the copper base plate (30). The exothermal metal passage (305) originally located on the bottom surface of the copper base plate (30) is, associated with the non-etched parts of the copper base plate (30), used to form a direct, effective, exothermal means for the die (33).

Figure 4:
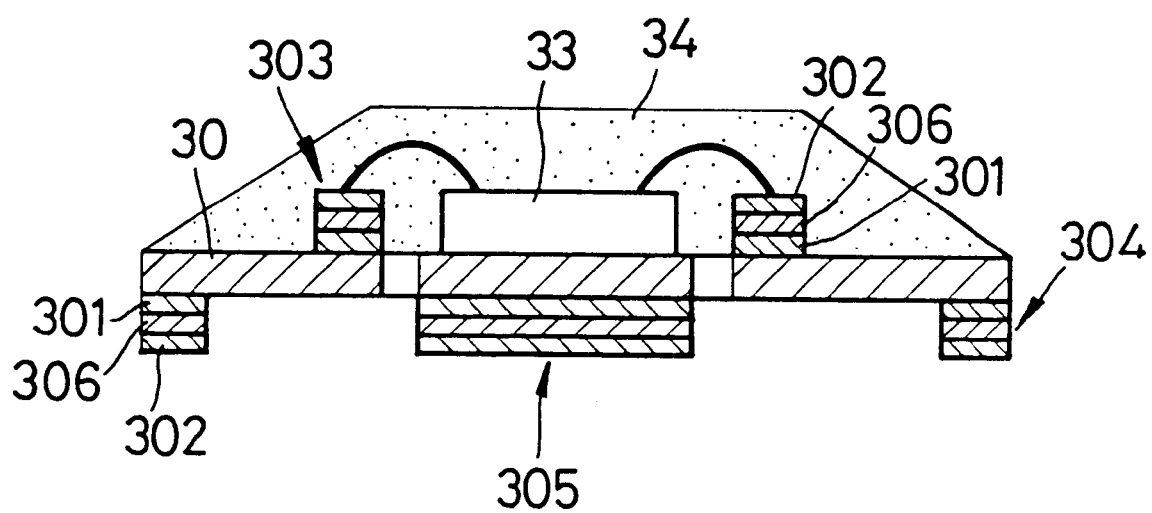
FIG. 4 is a side plan view of another preferred embodiment of the structure of a bump chip carrier in accordance with the present invention.
Figure 5:
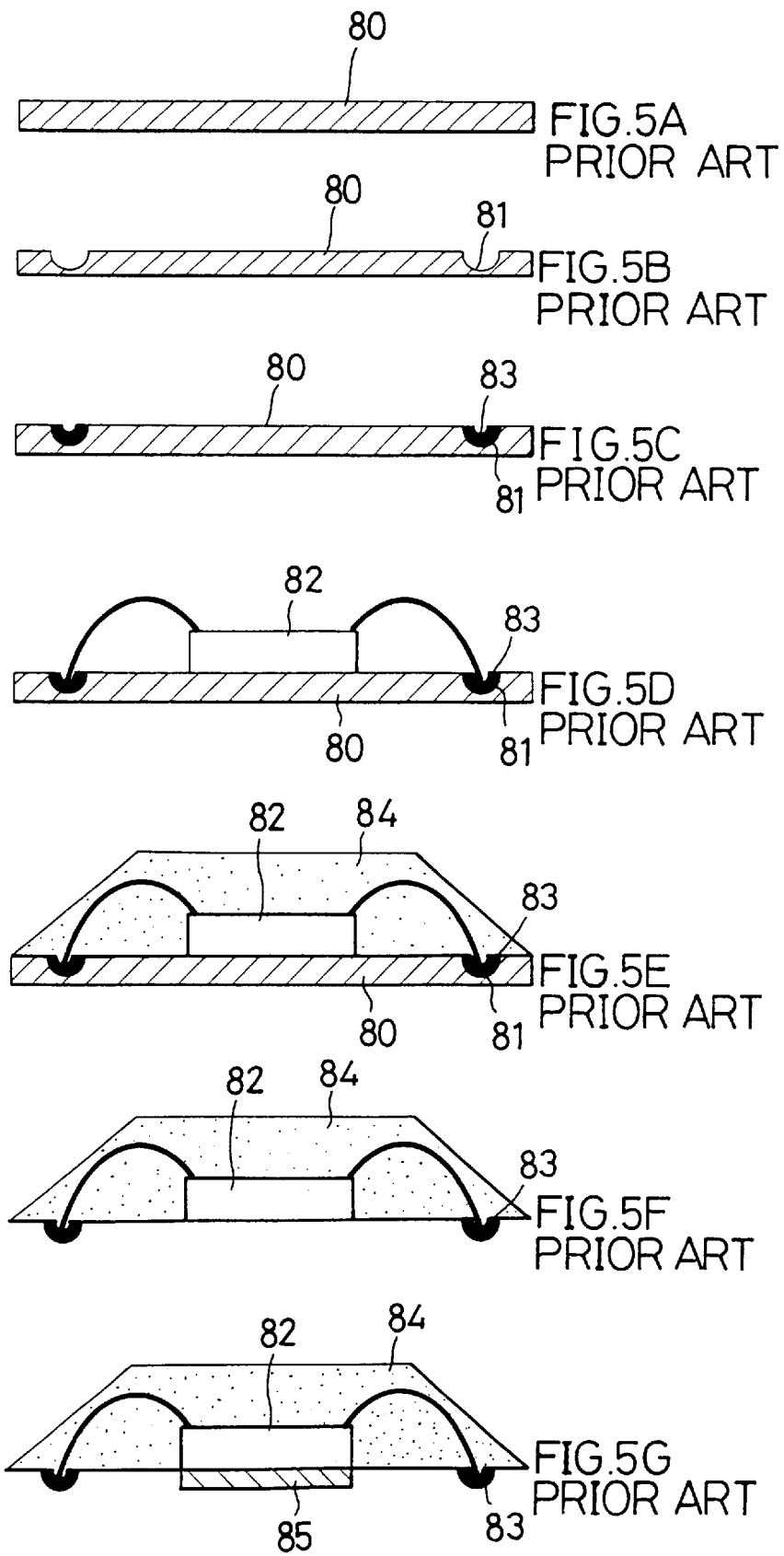
FIGS. 5A–5G are a sequence diagrams of the conventional method of molding a semi-conductor and the structure made thereby.
Figure 6:
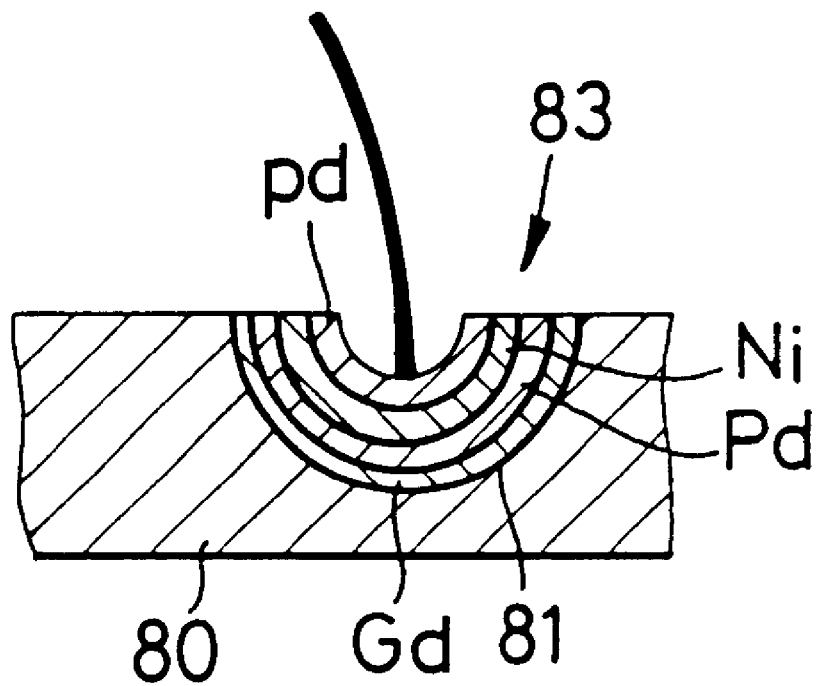
FIG. 6 a side plan view of the connection cavity in FIG. 5.

The fourth preferable embodiment in accordance with the present invention is an extension of the third embodiment in accordance with the present invention, such that the manufacturing steps of the fourth embodiment are similar to those of the third embodiment with the exception that the plating step of the fourth embodiment is different. As can be seen in FIG. 4, nickel layers (301), palladium layers (306) and gold layers (302) are sequentially plated onto the top and bottom surface of the copper base plate (30) to essentially prevent the gold layers (302) from being penetrated in the step of wire-bonding.

The third and the fourth embodiments in accordance with the present invention differ from the first and the second embodiments in accordance with the present invention in terms of the relative position of the die-connection pads to the external connection pads. In the first and the second embodiments, the die-connection pads (103) are respectively located to correspond to one of the external connection pads (104). In the third and the fourth embodiments, the die-connection pads (303) are not located to correspond to the external connection pads (304). As shown in FIGS. 3 and 4, the die-connection pads (303) are located near a pre-determined central position of the copper base plate (30) where a die is about to be mounted, while the external connection pads (304) are located near the edge of the copper base plate (30).

In addition to these two configurations regarding the relative locations of the die-connection pads to the external connection pads, each location of the die-connection pad can be exchanged with the location of each external connection pad. That is, the external connection pads (304) are located near a pre-determined central position of the copper base plate (30) where a die is about to be mounted, and the die-connection pads (303) are located near the edge of the copper base plate (30). In this case, the exothermal metal passage originally located under the part of the copper base plate (30) on which the die (33) is carried can be cancelled.

According to the above descriptions of the specific steps of each embodiment in accordance with the present invention, the advantages and the improvements over the prior art made by the present invention comprise at least the following ones:

(a) simplifying the manufacturing steps and reducing the manufacturing time:

The half-etching process is not employed in the method in accordance with the present invention resulting in at least two advantages. One of the advantage is that the manufacturing effectiveness is not adversely affected, since the critical control of the etched depth of the copper base plate is not necessary any more in the method in accordance with the present invention, while the control of the etched depth is always needed and should be precise in the half-etching process. The other advantage is that the manufacturing time of etching taken in the method in accordance with the present invention method is lowered to be a half of the manufacturing time taken in the method in accordance with the prior art, since a certain thickness of the copper base plate is not necessary in the present invention and the thickness of the copper base plate in the present invention is only a half of the thickness of the copper base plate used in the prior art. Additionally, the plating times in the method in accordance with the present invention are also reduced, so that the simplification in terms of the manufacturing steps and the reduction of the manufacturing time are both facilitated, too.

(b) lowering the cost:

The thickness of the copper base plate employed in the method in accordance with the present invention is only half of the thickness of the copper base plate used in the prior art method. Therefore, the manufacturing cost can be greatly reduced.

(c) lowering the weight and the thickness of the molded body:

Only one surface of the copper base plate is molded, thus the weight and thickness of the molded body are both lowered.

(d) having an ideal exothermal effect:

Since the molded body made in accordance with the present invention is much thinner and lighter and an exothermal metal passage is formed on the bottom of the copper base plate, the exothermal effect of the molded body is very ideal.

Although the present invention has been explained in relation to its preferred embodiment, it is to be understood that many other possible modifications and variations can be made without departing from the spirit and scope of the invention as hereinafter claimed.

What is claimed is:

1. A method of molding a bump chip carrier, comprising the steps of:

applying dry films respectively to a top and bottom surface of a copper base plate having a suitable thickness;

forming a circuit pattern on each one of the dry films by a photo engraving process;

plating variable metals arranged in a desired sequence onto each one of the circuit patterns forming a circuit used for die-connection pads on the top surface of the copper base plate and by simultaneously forming a circuit used for external connection pads and an exothermal metal passage on the bottom surface of the copper base plate;

removing the dry films;

fixedly mounting a die on the copper base plate and bonding the die with the connection pads by wires;

molding only one of the surfaces of the copper base plate to form a molding layer; and etching out excess parts of the copper base plate on the bottom of the molding layer.

2. The method of molding a bump chip carrier as claimed in claim 1, wherein a circuit pattern used for a connection pad is simultaneously transferred onto the dry film of the copper base plate at a position at which a die pad is located.

3. The method of molding a bump chip carrier as claimed in claim 1, wherein the die-connection pads on the top surface of the copper base plate are respectively located near a central portion of the copper base plate and the external connection pads on the bottom surface of the copper base plate are respectively located near an edge of the copper base plate.

4. The method of molding a bump chip carrier as claimed in claim 1, wherein the external connection pads on the bottom surface of the copper base plate are located near a central portion of the copper base plate and the die-connection pads on the top surface of the copper base plate are located near an edge of the copper base plate.

5. The method of molding a bump chip carrier as claimed in claim 1, wherein in the step of plating, a nickel layer and a gold layer are sequentially plated on to each of the circuit patterns used for the connection pads.

6. The method of molding a bump chip carrier as claimed in claim 1, wherein in the step of plating, a nickel layer, a palladium layer and a gold layer are sequentially plated on to each one of the circuit patterns used for the connection pads.

* * * * *